United States Patent

Chiba

[19]

[11] Patent Number: 6,148,187

[45] Date of Patent: Nov. 14, 2000

[54] AUTOMATIC FREQUENCY CONTROL METHOD AND CIRCUIT

[75] Inventor: Kenichiro Chiba, Tokyo, Japan

[73] Assignee: NEC Corporation, Tokyo, Japan

[21] Appl. No.: 09/094,068

[22] Filed: Jun. 9, 1998

[30] Foreign Application Priority Data

Jun. 9, 1997 [JP] Japan ................................. 9-164927

[51] Int. Cl.[7] .............................. H04B 1/26; H04L 27/22; H04L 27/14

[52] U.S. Cl. ..................................... 455/192.2; 455/192.1; 455/182.1; 455/182.2; 455/208; 455/214; 375/344; 331/175; 331/176

[58] Field of Search .......................... 455/192.1, 192.2, 455/208, 214, 222, 255, 182.1, 182.2, 324; 375/344; 331/175, 176, 177 R

[56] References Cited

U.S. PATENT DOCUMENTS

| | | | |
|---|---|---|---|
| 4,921,467 | 5/1990 | Lax ....................................... | 455/192.2 |
| 5,263,195 | 11/1993 | Panther et al. ......................... | 455/182.2 |
| 5,335,348 | 8/1994 | Kono ..................................... | 455/192.2 |
| 5,517,678 | 5/1996 | Klank et al. ........................... | 455/182.2 |
| 5,594,759 | 1/1997 | Iwamatsu ............................... | 375/344 |
| 5,633,898 | 5/1997 | Kishigami et al. ..................... | 375/344 |
| 5,634,205 | 5/1997 | Kurisu et al. .......................... | 455/182.2 |
| 5,678,223 | 10/1997 | Callaway, Jr. et al. .............. | 455/192.2 |
| 5,727,030 | 3/1998 | Miyashita ............................... | 375/344 |
| 5,963,851 | 10/1999 | Blanco et al. .......................... | 455/192.2 |

FOREIGN PATENT DOCUMENTS

| | | | |
|---|---|---|---|
| 10-98355 | 4/1988 | Japan ................................ | H04B 1/26 |
| 7-111482 | 4/1995 | Japan ................................ | H04B 7/26 |
| 7-245563 | 9/1995 | Japan ................................ | H03L 7/18 |
| 10-32513 | 2/1998 | Japan ................................ | H04B 1/16 |
| 10-276110 | 10/1998 | Japan ................................ | H04B 1/26 |
| 2205460 | 12/1988 | United Kingdom .............. | H03L 1/02 |

OTHER PUBLICATIONS

Japanese Office Action issued Nov. 30, 1999 in a related application and English translation of relevant portions.

*Primary Examiner*—Lee Nguyen
*Assistant Examiner*—Simon Nguyen
*Attorney, Agent, or Firm*—Ostrolenk, Faber, Gerb & Soffen, LLP

[57] ABSTRACT

The invention provides an automatic frequency control (AFC) method and circuit for use with a receiver by which deterioration of the reception characteristic of the receiver due to frequency error of the reference oscillator (e.g. a VCO) of a quasi-synchronous detection circuit arising from initial deviation, aging, or temperature characteristics is suppressed. During operation of the receiver, only when frame synchronization is established, the set value that the frequency control circuit determines for the VCO is periodically stored into a non-volatile memory together with current ambient temperature information of the VCO. When information that power supply has been turned on or that a changing over of the reception channel has occurred is received from an apparatus control processor, one of the stored values of the non-volatile memory is read back into the frequency control circuit in response to the current ambient temperature of the VCO by a control circuit and switches, and is used as the initial set value for the VCO. This decreases the time required for convergence of AFC and improves the synchronization acquisition characteristic of the receiver.

4 Claims, 6 Drawing Sheets

FIG. 2(a)

SWITCH 7

| STATE OF RECEIVER | STATE OF SWITCH 7 |
|---|---|
| ORDINARY OPERATION | OFF |
| TURNING ON OF APPARATUS POWER SUPPLY | SWITCHED ON ONLY ONCE IMMEDIATELY AFTER RESETTING OF VCO |

FIG. 2(b)

SWITCH 8

| TEMPERATURE MEASUREMENT VALUE | STATE OF SWITCH 8 |
|---|---|
| -10° C OR LESS | SELECT MEMORY CELL M1 |
| -9° ~ 0° C | SELECT MEMORY CELL M2 |
| 1° ~ 10° C | SELECT MEMORY CELL M3 |
| ⋮ | ⋮ |
| 61° ~ 70° C | SELECT MEMORY CELL MN |

FIG. 2(c)

| SWITCH 9 | |
|---|---|
| RECEPTION FRAME SYNCHRONIZATION | STATE OF SWITCH 9 |
| YES | ON (UPDATE MEMORY) |
| NO | OFF (NOT UPDATE MEMORY) |

AUTOMATIC FREQUENCY CONTROL METHOD AND CIRCUIT

BACKGROUND OF THE INVENTION

1. Field of the Invention

The present invention relates to an automatic frequency control (AFC) circuit for a receiver, and more particularly to a controlling method and circuit for the voltage controlled oscillator within a receiver which utilizes the local oscillator comprising its quasi-synchronous detection circuit to generate the reference frequency for AFC frequency control.

2. Description of the Related Art

Conventionally, in order to realize automatic frequency control (AFC) of a radio receiver, a control voltage is determined based on frequency error information obtained from a carrier regeneration circuit or some other circuit of the demodulator, and the control voltage is used to control a reference oscillator (typically a voltage controlled oscillator (VCO) or similar circuit) of a quasi-synchronous detector.

FIG. 4 shows an exemplary construction of a conventional AFC circuit. Referring to FIG. 4, the AFC circuit shown is formed as an AFC control loop which includes a quasi-synchronous detection circuit 21, a low-pass filter 22, a demodulation circuit 23, a frequency control circuit 25 and a voltage controlled oscillator (VCO) 26.

In operation, the voltage controlled oscillator (VCO) 26 normally oscillates with a reference frequency roughly synchronized with the received signal inputted from an antenna amplifier (not shown) to the quasi-synchronous detection circuit 21, and the oscillation output of the voltage controlled oscillator 26 is inputted to the quasi-synchronous detection circuit 21. The quasi-synchronous detection circuit 21 performs quasi-synchronous detection using the output of the voltage controlled oscillator 26 as a reference frequency. The low-pass filter 22 removes unnecessary frequency components and noise components from the received signal outputted from the quasi-synchronous detection circuit 21. In the demodulation circuit 23, a multiplier 231 synchronously detects the output of the low-pass filter 22 using a regenerated carrier outputted from a carrier regeneration circuit 232 to regenerate the received data.

The carrier regeneration circuit 232 regenerates the received carrier from the synchronous detection output obtained from the multiplier 231 and outputs remaining frequency error information "a" of the received signal at the input of the demodulation circuit 23. The frequency control circuit 25 controls the control voltage for the VCO 26 based on the remaining frequency error information "a" so that the frequency error may be reduced.

Generally, an oscillator to be used as the frequency reference to a quasi-synchronous detector such as, for example, the voltage controlled oscillator (VCO) 26 in the AFC circuit of FIG. 4 is required to have a high frequency accuracy and a high frequency stability, because the output thereof is multiplied up to a frequency of the radio frequency band. This becomes critical because any frequency error of the oscillator which arises from an initial deviation, aging, a temperature characteristic or some other factor is amplified by the multiplication. As a result, as viewed from the demodulation circuit in the following stage, any frequency error originating from the VCO is added to the frequency error of the signal being received. This makes the performance requirements upon the demodulator more severe (in terms of frequency synchronization acquisition range).

In particular, if the VCO is reset for some reason, such as the turning on of the power supply to the apparatus or the changing over of a channel, then this gives rise to a problem of how to determine the initial set value for the VCO. In this instance, if the initial set value for the VCO after resetting is not close to the final converged value to be determined by AFC, then the frequency error arising from the frequency deviation of the VCO is superposed on the signal after detection, resulting in a degradation of the initial synchronization acquisition characteristic of the received signal.

Meanwhile, in a system of the type wherein the bandwidth of each channel and the channel frequency interval are narrow with respect to a radio frequency (such as a low data rate satellite communication system), there is the possibility that incorrect synchronization to an adjacent channel may occur. Further, where the deviation of the VCO is excessively large, there is a problem in that the frequency range of the signal after detection partially falls outside the pass band of the low pass filter 22, resulting in deterioration of the signal to noise ratio and hence in deterioration of the reception synchronization acquisition characteristic.

Where digital demodulation is employed, synchronization acquisition can be improved by adding, within the synchronization acquisition process of the received signal, a step of estimating the frequency error between the frequencies of the VCO and the received signal using Fourier transform calculation. This countermeasure, however, is disadvantageous in that the required time for synchronization acquisition is elongated by a time corresponding to the calculation time required for the estimation.

From the reasons described above, the conventional design requires the use of a high precision, highly stable (and consequently, expensive) oscillator which has low frequency fluctuation due to initial deviation, aging, or ambient temperature.

SUMMARY OF THE INVENTION

It is the objective of the present invention to provide an automatic frequency control method and circuit, applicable for use with a receiver wherein the local oscillator of a quasi-synchronization detection circuit is used to produce the reference frequency for AFC control, which would stabilize the frequency output of the reference oscillator of the quasi-synchronous detection circuit and thus suppress the influence of frequency deviations of the reference oscillator upon the reception characteristic of the receiver, leading to improvement of the signal synchronization acquisition characteristic and reduction of the cost of the receiver by enabling the use of lesser quality VCOs.

In order to attain the objective described above, one aspect of the present invention is its proposal of an automatic frequency control method, comprising the steps of quasi-synchronously detecting the received signal using an oscillation output of a voltage controlled oscillator as a reference signal, regenerating the received carrier from the quasi-synchronous detection output to synchronously detect the quasi-synchronous detection output to regenerate the received data, feeding back remaining frequency error information of the quasi-synchronously detected signal to a frequency control circuit for controlling the voltage controlled oscillator, storing the frequency control values successively outputted from the frequency control circuit in a corresponding relationship to ambient temperatures of the voltage controlled oscillator at that time, and reading out, upon turning on of power supply or upon changing over of a channel, one of the frequency control values corresponding to the current ambient temperature of the voltage controlled oscillator and supplying the read out frequency control value as an initial set value to the voltage controlled oscillator.

The stored frequency control values may be updated while frame synchronization with the regenerated received data is established.

Another aspect of the present invention, is its proposal of an automatic frequency control circuit for a receiver which includes a quasi-synchronous detection circuit for quasi-synchronously detecting the received signal using a voltage controlled oscillator as a reference oscillator, a demodulation circuit for regenerating the received carrier from an output of the quasi-synchronous detection circuit to synchronously detect the quasi-synchronous detection output to regenerate received data and to output remaining frequency error information of the quasi-synchronously detected signal, and a frequency control circuit for controlling the voltage controlled oscillator based on the remaining frequency error information so that the frequency error may be reduced, the automatic frequency control circuit comprising temperature measurement means for measuring the ambient temperature of the voltage controlled oscillator, storage means for storing frequency control values successively outputted from the frequency control circuit in a corresponding relationship to measurement temperatures of the temperature measurement means, and means operable upon turning on of power supply to the receiver or upon changing over of the reception channel for reading out, for selecting from the storage means one of the stored frequency control values which corresponds to the current ambient temperature of the voltage oscillator, and for supplying that read out frequency control value to the voltage controlled oscillator as an initial set value.

The automatic frequency control circuit for a receiver may further comprise a frame synchronization circuit for establishing frame synchronization based on the regenerated data output of the demodulation circuit, and controlling means for controlling the updating of the stored values of the storage means in response to a frame synchronous condition.

In a condition wherein frame synchronization has been established as a result of completion of frequency synchronization through the functioning of the AFC, the set value which is sent from the frequency control circuit to the VCO will have a value which compensates for all frequency error components which arise from various deviations of the VCO. During operation of the receiver, and only while frame synchronization is established, the set value for the VCO is periodically stored into the storage means together with current ambient temperature information of the VCO. This enables the AFC circuit to benefit from a "learning effect", whereby the AFC circuit builds up a database of optimal VCO settings for any given temperature which is unique to the VCO used in the receiver, and which compensates for any frequency error components arising from various deviations of that VCO.

When information indicating that the power supply has been turned on or that a changing over of the reception channel has occurred is received from the apparatus control processor, then one of the values stored in the storage means which corresponds to the current ambient temperature is recalled from the storage means and is used as an initial set value for the VCO. Because the AFC commences its frequency acquisition process from an initial value which is much closer to its final convergence value, the time required for convergence of AFC is reduced.

An advantage of this method is that even if a reference oscillator which is somewhat inferior in terms of frequency accuracy and frequency stability is employed in the receiver, the learning function of the AFC circuit will compensate for frequency errors arising from initial deviation, aging or temperature characteristics of the reference oscillator, thus enabling performance comparable to that obtained employing a higher-quality reference oscillator. Thus, this method will enable the design of lower-cost receivers.

Further, since the apparent frequency error of the received signal upon initial synchronization acquisition is reduced, the synchronization acquisition characteristic of the receiver is stabilized. Consequently, since a frequency estimation routine or the like need not be added, reduction of the AFC acquisition and synchronization acquisition time can be achieved.

The above and other objectives, features and advantages of the present invention will become apparent from the following description and the appended claims, taken in conjunction with the accompanying drawings in which like parts or elements are denoted by like reference symbols.

BRIEF DESCRIPTION OF THE DRAWINGS

FIGS. 2(a), 2(b) and 2(c) are tables illustrating switch control logic employed in the automatic frequency control circuit of FIG. 1;

DESCRIPTION OF THE PREFERRED EMBODIMENT

Figure 1:
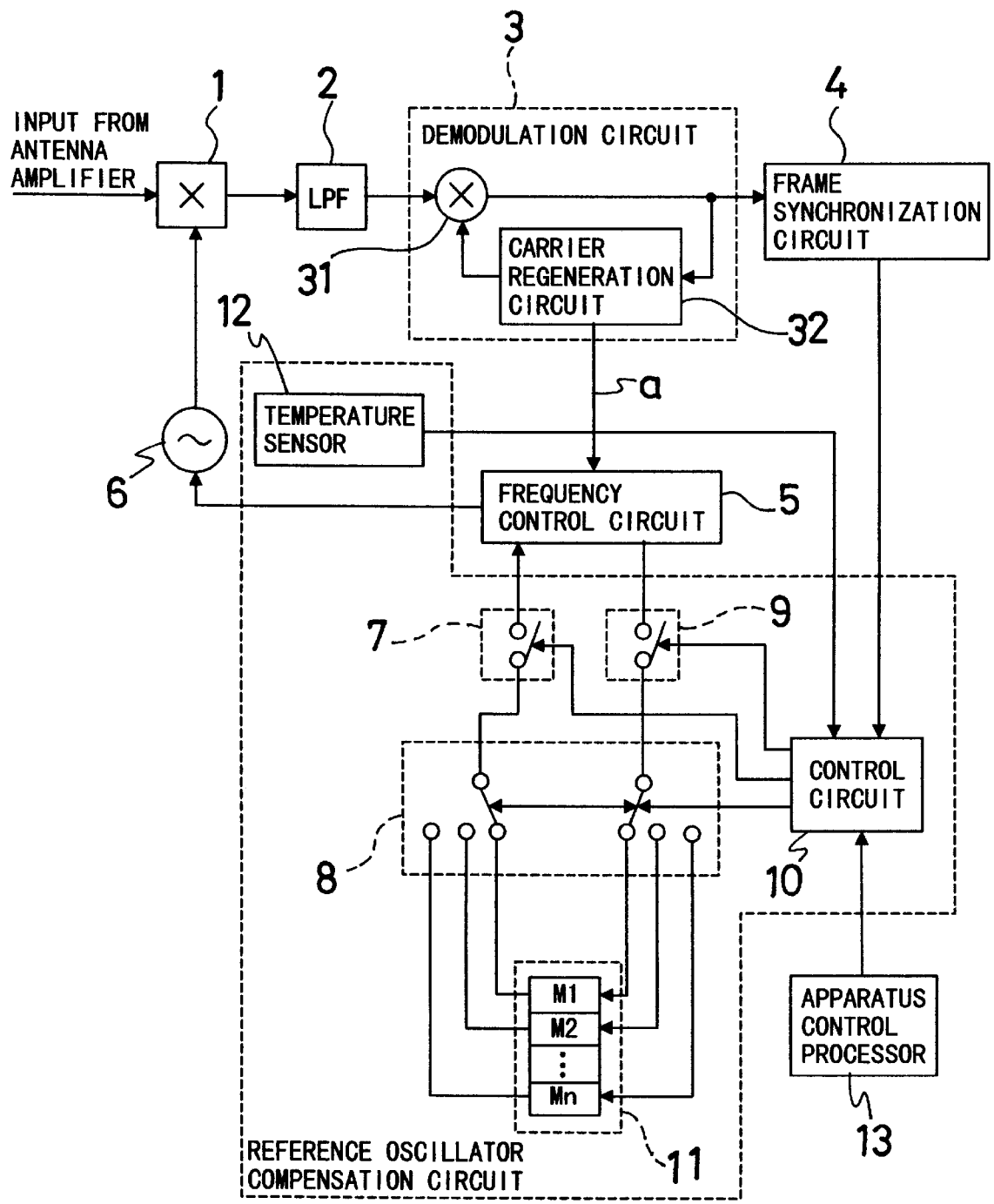
FIG. 1 is a block diagram of an automatic frequency control circuit to which the present invention is applied.

Referring first to FIG. 1, there is shown in block diagram form a receiver to which an automatic frequency control circuit according to the present invention is applied. The receiver shown includes a quasi-synchronous detection circuit 1, a low-pass filter (LPF) 2, a demodulation circuit 3, a multiplier 31, a carrier regeneration circuit 32, a frame synchronization circuit 4, a frequency control circuit 5, a VCO 6, switches 7, 8 and 9, a control circuit 10, a non-volatile memory 11, a temperature sensor 12, and an apparatus control processor 13. The switches 7, 8 and 9, control circuit 10, non-volatile memory 11 and temperature sensor 12 compose a reference oscillator compensation circuit.

In operation, received data is regenerated and information a of the remaining frequency error component is detected by a same process as that of the conventional AFC circuit described hereinabove with reference to FIG. 4. The frame synchronization circuit 4 establishes received frame synchronization from the received data and outputs current frame synchronization information.

Figure 4:
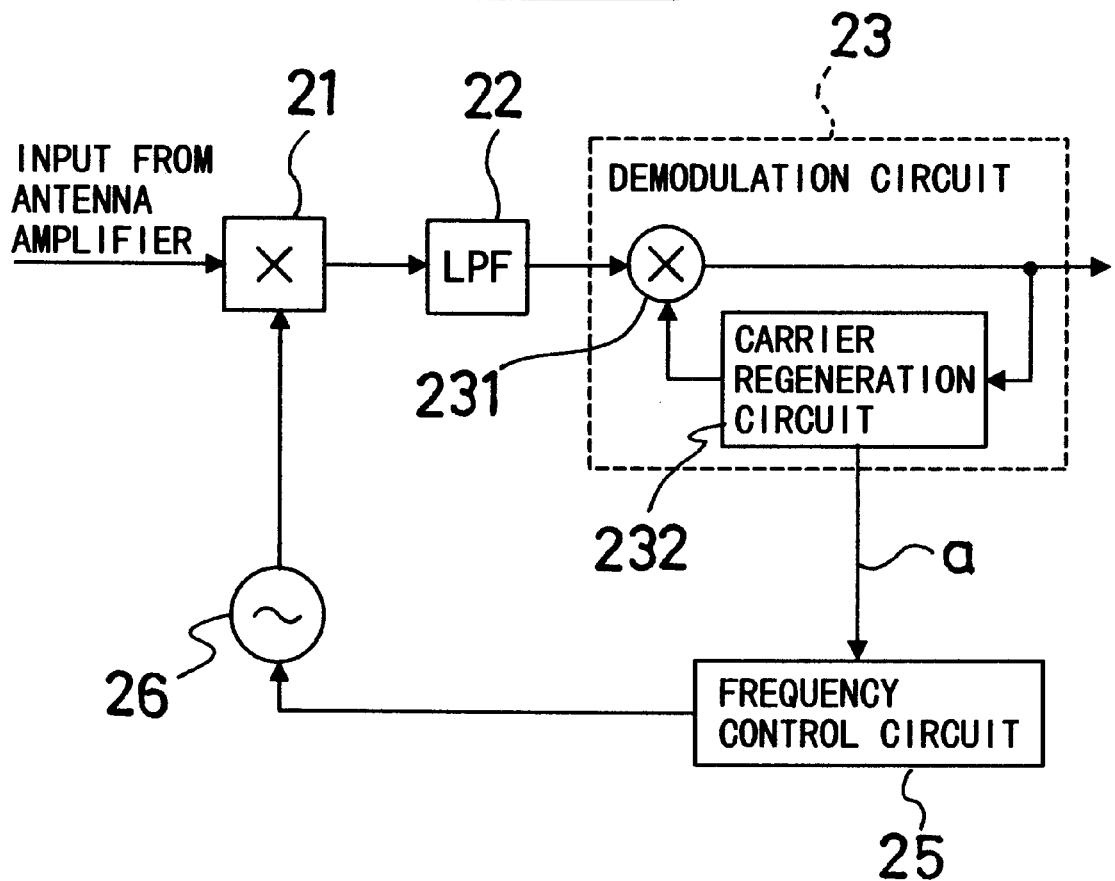
FIG. 4 is a block diagram showing a conventional automatic frequency control circuit.

The frequency control circuit 5 calculates a control value for the VCO 6 from the remaining frequency error information a in a similar manner as in the conventional AFC circuit of FIG. 4 and outputs the calculated control value also to the non-volatile memory 11 through the switch 9. Further, the frequency control circuit 5 reads in a control value from the non-volatile memory 11 through the switch 7 and sets the control value as a frequency control circuit output value to the VCO 6.

The non-volatile memory 11 includes n memory cells M1, M2, . . . , Mn and can store n VCO set values corresponding to n temperature conditions or values, or more accurately, temperature ranges as seen in FIG. 2(a).

The control circuit 10 controls the switches 7, 8 and 9 in response to information received from the temperature sensor 12, apparatus control processor 13 and frame synchronization circuit 4. An example of the control logic for such control is illustrated in FIGS. 2(*a*) to 2(*c*). In particular, the switch 7 allows the VCO control value stored in the memory to be read into the frequency control circuit 5 only once when the power supply to the receiver is turned on and the VCO 6 is reset. The switch 8 selects one of the memory cells of the non-volatile memory 11 into or from which data is to be stored or recalled in response to the temperature of the VCO 6. The switch 9 is closed to allow updating of the stored values of the memory cells of the non-volatile memory 11 only while frame synchronization is established.

Figure 3:
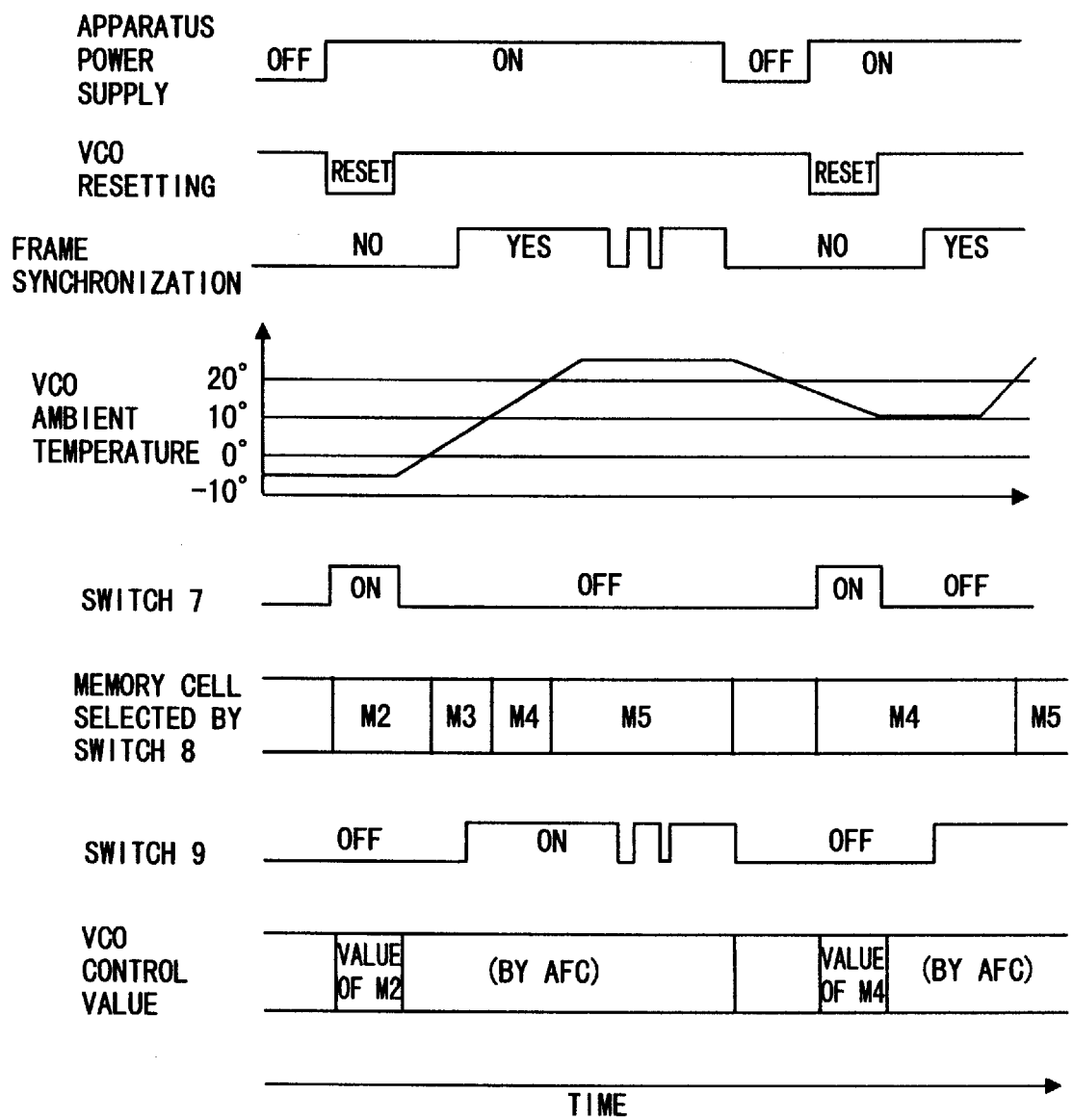
FIG. 3 is a time chart illustrating control operations for switches and a VCO of the automatic frequency control circuit of FIG. 1.

FIG. 3 shows an example of a time chart which illustrates controlling processes of the switches, storage of the memory cells and initialization of the VCO in response to the frame synchronization condition and the temperature.

By the operations of the components of the automatic frequency control circuit described above, the VCO control value while frame synchronization is established (that is, while frequency synchronization acquisition is achieved sufficiently) is periodically stored into the non-volatile memory 11 together with information regarding the current VCO ambient temperature. Consequently, while the ambient temperature of the VCO varies, for example, as seen in FIG. 3, during operation of the receiver, different VCO control values are successively stored into the non-volatile memory 11 in a corresponding relationship to different ambient temperatures (temperature ranges). Then, when power supply is turned on next time after some interval of rest time (see FIG. 3), one of the set values stored in the non-volatile memory 11 which corresponds to the ambient temperature of the VCO then is set to the VCO and used as an initial set value for frequency control. Consequently, occurrence of the phenomenon in which a frequency deviation of the VCO which originates in the temperature characteristic and so forth adds a frequency error to the quasi-synchronous detection signal can be prevented. In addition, by nature the fact that the data within the non-volatile memory 11 is updated whenever the receiver is in use, this method will also compensate for frequency deviation of the VCO which originates from aging.

While a preferred embodiment of the present invention has is been described using specific terms, such description is for illustrative purpose only, and it is to be understood that changes and variations may be made without departing from the spirit or scope of the following claims.

What is claimed is:

1. An automatic frequency control method comprising the steps of:

quasi-synchronously detecting the received signal using the oscillation output of a voltage controlled oscillator as a reference signal;

regenerating the received carrier from the quasi-synchronous detection output, to synchronously detect the quasi-synchronous detection output to regenerate the received data;

feeding back remaining frequency error information of the quasi-synchronously detected signal to a frequency control circuit for controlling said voltage controlled oscillator;

storing frequency control values successively outputted from said frequency control circuit in a corresponding relationship to ambient temperatures of said voltage controlled oscillator at the time; and reading out, upon turning on of the power supply or upon changing over a channel, one of the frequency control values corresponding to the current ambient temperature of said voltage controlled oscillator and supplying the read out frequency control value as the initial set value to said voltage controlled oscillator;

wherein the stored frequency control values are updated in response to a frame synchronization condition based on said regenerated received data.

2. An automatic frequency control circuit for a receiver which includes a quasi-synchronous detection circuit for quasi-synchronously detecting the received signal using a voltage controlled oscillator as a reference oscillator, a demodulation circuit for regenerating the received carrier from an output of said quasi-synchronous detection circuit to synchronously detect the quasi-synchronous detection output to regenerate received data and outputting remaining frequency error information of the quasi-synchronously detected signal, and a frequency control circuit for controlling said voltage controlled oscillator based on the remaining frequency error information so that the frequency error may be reduced, said automatic frequency control circuit comprising:

a temperature measurement means for measuring an ambient temperature of said voltage controlled oscillator;

storage means for storing frequency control values successively outputted from said frequency control circuit in a corresponding relationship to measurement temperatures of said temperature measurement means; and means operable upon turning on of power supply to said receiver or upon changing over of the reception channel for reading out, in response to a current ambient temperature of said voltage controlled oscillator, that one of the frequency control values which corresponds to the ambient temperature from said storage means and supplying the read out frequency control value as an initial set value to said voltage controlled oscillator; and further comprising a frame synchronization circuit for establishing frame synchronization based on the regenerated data output of said demodulation circuit, and controlling means for controlling updating of the stored values of said storage means in response to the frame synchronization condition.

3. An automatic frequency control circuit for a receiver which includes a quasi-synchronous detection circuit for quasi-synchronously detecting the received signal using a voltage controlled oscillator as a reference oscillator, a filter for removing unnecessary frequency components and noise components from the received signal outputted from said quasi-synchronous detection circuit, a demodulation circuit for regenerating the received carrier from an output of said filter to synchronously detect the filter output to regenerate received data and outputting remaining frequency error information of the quasi-synchronously detected signal, and a frequency control circuit for controlling said voltage controlled oscillator based on the remaining frequency error information so that the frequency error may be reduced, said automatic frequency control circuit comprising:

a temperature sensor for detecting the ambient temperature of said voltage controlled oscillator;

an apparatus control processor for providing reset information for said voltage controlled oscillator upon turning on of power supply to said receiver or upon changing over of the reception channel;

a frame synchronization circuit for establishing frame synchronization based on the regenerated data output of said demodulation circuit;

storage means for storing frequency control values successively outputted from said frequency control circuit at different ambient temperatures of said voltage controlled oscillator;

first selection means for controlling the reading out of a frequency control value from said storage means;

second selection means for controlling the updating of the stored values of said storage means in response to a frame synchronization condition;

third selection means for selecting an address of said storage means into or from which a frequency control value is to be stored or read out in response to the current ambient temperature of said voltage controlled oscillator; and a control circuit for controlling said first, second and third control means based on the information from said apparatus control processor, temperature sensor and frame synchronization circuit.

4. An automatic frequency control circuit for receiver which includes a quasi-synchronous detection circuit for quasi-synchronously detecting the received signal using a voltage controlled oscillator as a reference oscillator, a filter for removing unnecessary frequency components and noise components from the received signal outputted from said quasi-synchronous detection circuit, a demodulation circuit for regenerating the received carrier from an output of said filter to synchronously detect the filter output to regenerate received data and outputting remaining frequency error information of the quasi-synchronously detected signal, and a frequency control circuit for controlling said voltage controlled oscillator based on the remaining frequency error information so that the frequency error may be reduced, said automatic frequency control circuit comprising:

a temperature sensor for detecting the ambient temperature of said voltage controlled oscillator;

an apparatus control processor for providing reset information for said voltage controlled oscillator upon turning on of power supply to said receiver or upon changing over of the reception channel;

a frame synchronization circuit for establishing frame synchronization based on the regenerated data output of said demodulation circuit;

a store for storing frequency control values successively outputted from said frequency control circuit at different ambient temperatures of said voltage controlled oscillator;

a selection circuit for controlling the reading out of a frequency control value from said store, controlling the updating of the stored values of said store in response to a frame synchronization condition, and selecting an address of said store into or from which a frequency control value is to be stored or read out in response to the current ambient temperature of said voltage controlled oscillator; and a control circuit for controlling said selection circuit based on the information from said apparatus control processor, temperature sensor and frame synchronization circuit.

* * * * *